US010252464B2

United States Patent
Kuo et al.

(10) Patent No.: US 10,252,464 B2
(45) Date of Patent: Apr. 9, 2019

(54) SLICING PRINTING METHOD FOR COLOR 3D MODEL

(71) Applicants: XYZPRINTING, INC., New Taipei (TW); KINPO ELECTRONICS, INC., New Taipei (TW)

(72) Inventors: Tsung-Hua Kuo, New Taipei (TW); Yao-Te Huang, New Taipei (TW)

(73) Assignees: XYZPRINTING, INC., New Taipei (TW); KINPO ELECTRONICS, INC., New Taipei (TW)

( * ) Notice: Subject to any disclaimer, the term of this patent is extended or adjusted under 35 U.S.C. 154(b) by 302 days.

(21) Appl. No.: 15/171,489

(22) Filed: Jun. 2, 2016

(65) Prior Publication Data
US 2017/0269475 A1 Sep. 21, 2017

(30) Foreign Application Priority Data

Mar. 18, 2016 (CN) .......................... 2016 1 0154811

(51) Int. Cl.
*B29C 64/112* (2017.01)
*B29C 47/92* (2006.01)
(Continued)

(52) U.S. Cl.
CPC ............ *B29C 64/112* (2017.08); *B28B 1/001* (2013.01); *B29C 47/92* (2013.01); *B29C 64/393* (2017.08);
(Continued)

(58) Field of Classification Search
CPC ......... B33Y 10/00; B33Y 30/00; B33Y 50/00; B33Y 50/02; B33Y 40/00; B33Y 80/00;
(Continued)

(56) References Cited

U.S. PATENT DOCUMENTS 6,612,824 B2 * 9/2003 Tochimoto .............. B29C 41/36
425/130
6,652,256 B2 * 11/2003 Coe ..................... B29C 67/0059
264/401
(Continued)

FOREIGN PATENT DOCUMENTS

EP           1314540 A1      5/2003
JP         2002036374 A      2/2002

OTHER PUBLICATIONS

Search Report dated May 30, 2017 of the corresponding European patent application No. 16173991.7.
(Continued)

*Primary Examiner* — Crystal J Barnes-Bullock
(74) *Attorney, Agent, or Firm* — Chun-Ming Shih; HDLS IPR Services

(57) ABSTRACT

A slicing printing method for color 3D model is disclosed. The method comprises following steps of: building a color 3D object into a coloring model; dividing the coloring model into a plurality of color cells, wherein a shell of each of the color cells forms an accommodating space configured to accommodate a color material; setting respectively the color of the color material accommodated by each color cell according to the color of the color 3D object and generating a printing color data corresponding to the color 3D model; generating a printing object data associated with the printing color data according to the color cells. The disclosed example can effectively realize the printing of the color 3D model through the inkjet manner via generating color cells configured to accommodate color materials.

14 Claims, 9 Drawing Sheets

(51) Int. Cl.
| | |
|---|---|
| *B29C 64/393* | (2017.01) |
| *B29C 64/40* | (2017.01) |
| *B33Y 50/02* | (2015.01) |
| *B33Y 30/00* | (2015.01) |
| *B33Y 40/00* | (2015.01) |
| *B33Y 80/00* | (2015.01) |
| *G05B 15/02* | (2006.01) |
| *G05B 19/042* | (2006.01) |
| *G05B 19/4099* | (2006.01) |
| *B28B 1/00* | (2006.01) |
| *G06F 3/12* | (2006.01) |
| *G06F 17/50* | (2006.01) |
| *G06T 17/00* | (2006.01) |
| *G03F 7/00* | (2006.01) |
| *H04N 1/60* | (2006.01) |
| *B33Y 10/00* | (2015.01) |
| *B29C 64/386* | (2017.01) |
| *B33Y 50/00* | (2015.01) |

(52) U.S. Cl.
CPC .............. *B29C 64/40* (2017.08); *B33Y 10/00* (2014.12); *B33Y 30/00* (2014.12); *B33Y 40/00* (2014.12); *B33Y 50/02* (2014.12); *B33Y 80/00* (2014.12); *G03F 7/0037* (2013.01); *G05B 15/02* (2013.01); *G05B 19/042* (2013.01); *G05B 19/4099* (2013.01); *G06F 3/12* (2013.01); *G06F 17/50* (2013.01); *G06T 17/00* (2013.01); *H04N 1/60* (2013.01); *B29C 64/386* (2017.08); *B33Y 50/00* (2014.12); *G05B 2219/49007* (2013.01); *G05B 2219/49019* (2013.01)

(58) Field of Classification Search
CPC ....... B29C 64/386; B29C 47/92; B29C 64/10; B29C 64/106; B29C 64/112; B29C 64/393; B29C 64/40; B28B 1/001; B26K 2995/002; B26K 2995/0021; G06F 3/12; G06F 17/50; G05B 15/02; G05B 19/042; G05B 19/4099; G05B 2219/35134; G05B 2219/49007; G05B 2219/49023; G06T 17/00

See application file for complete search history.

(56) References Cited

U.S. PATENT DOCUMENTS

| | | | | |
|---|---|---|---|---|
| 6,799,959 | B1* | 10/2004 | Tochimoto | B29C 41/12 425/130 |
| 7,991,498 | B2* | 8/2011 | Kritchman | B29C 67/0059 101/171 |
| 9,278,474 | B1* | 3/2016 | Chang | B29C 64/106 |
| 9,688,022 | B2* | 6/2017 | Chang | B29C 67/0007 |
| 9,833,948 | B2* | 12/2017 | Stava | B29C 64/386 |
| 9,972,123 | B2* | 5/2018 | Sparks | G05B 15/02 |
| 2005/0225007 | A1* | 10/2005 | Lai | G05B 19/4099 264/308 |
| 2010/0195122 | A1 | 8/2010 | Kritchman | |
| 2011/0222081 | A1* | 9/2011 | Yi | G06T 17/00 358/1.9 |
| 2014/0324204 | A1 | 10/2014 | Vidimce et al. | |
| 2015/0258770 | A1 | 9/2015 | Chan et al. | |
| 2015/0321425 | A1* | 11/2015 | Stava | G06F 17/50 700/98 |
| 2016/0339643 | A1* | 11/2016 | Dikovsky | B41M 5/0082 |
| 2017/0043498 | A1* | 2/2017 | Shih | B29C 67/0081 |
| 2017/0165917 | A1* | 6/2017 | McKiel, Jr. | B29C 67/0088 |
| 2017/0217103 | A1* | 8/2017 | Babaei | B33Y 10/00 |
| 2017/0341305 | A1* | 11/2017 | Miller | G05B 19/4099 |
| 2018/0071984 | A1* | 3/2018 | Lee | B33Y 30/00 |
| 2018/0162057 | A1* | 6/2018 | Chen | B33Y 10/00 |

OTHER PUBLICATIONS

Y G Im et al: "Functional prototype development: inner visible multi-color prototype fabrication process using stereo lithography", Dec. 1, 2002.

Office Action dated Feb. 5, 2019 of the corresponding Japan patent application.

* cited by examiner

SLICING PRINTING METHOD FOR COLOR 3D MODEL

BACKGROUND OF THE INVENTION

Technical Field

The technical field relates to a slicing printing method for 3D model, in particular to a slicing printing method for color 3D model.

Description of Prior Art

The Stereo-lithography (SL) 3D printing technique and the digital light processing (DLP) 3D printing technique mainly use UV curable resins in liquid state as printing supplies, and imposing lights (such as ultraviolet lights or laser lights) on UV curable resins during the printing process to induce the occurrence of solidification of UV curable resins via the polymerization effect, thereby the 3D model of the entity.

Although there are many options on colors of UV curable resins in the market available for users to choose from, but existing Stereo-lithography (SL) 3D printers do not have multi-color printing functions. Also, since different colors of UV curable resins cannot be uniformly mixed up, existing Stereo-lithography (SL) 3D printers cannot deploy UV curable resins with variety of colors. If users would like to print the color 3D model, they need to use the monochrome UV curable resins to print the monochrome 3D model, and then draw the monochrome 3D model to the color 3D model via hand drawing manner. Therefore, existing manufacture methods for color 3D models using Stereo-lithography (SL) techniques or digital light processing techniques are not only time consuming, but also labor wasting.

SUMMARY OF THE INVENTION

The disclosure is directed to provide a slicing printing method for color 3D model, which can produce a printing data configured to print color 3D model.

One of the exemplary embodiments, a slicing printing method for color 3D model comprises following steps implemented by a processor of:

a) building a coloring model according to a color 3D object;

b) dividing the coloring model into a plurality of color cells, wherein a shell of each of the color cells forming an accommodating space configured to accommodate a color material;

c) setting respectively the colors of the color materials accommodated in each of the color cells according to the color of the color 3D object, and generating a printing color data corresponding to the color 3D model; and d) generating a printing object data associated with the printing color data according to the printing color data and the color cells.

Preferably, the step a) is to build the coloring model and an interior model according to the color 3D object. The step d) is to generate the printing object data corresponding to the color 3D model according to the printing color data, the interior model and the color cells.

Preferably, the step a) comprising a step a1): dividing the color 3D model into the coloring model and the interior model according to a coloring thickness.

Preferably, the step a1) is to divide the color 3D model into the coloring model and the hollow interior model.

Preferably, the step b) comprises a step b1): dividing the coloring model into the color cells according to a number of color cells and a size of color cells.

Preferably, the color cells are columns.

Preferably, the step b) further comprises a step b2): adding a top cover on the shell of the color cell when judging one of the color cells is on the top layer.

Preferably, the step a1) divides the color 3D model according to the coloring thickness, the number of color cells and the size of color cells.

Preferably, the step c) comprises the following steps:

c11) retrieving an object color of one of the plurality portions of the color 3D object.

c12) setting colors of the color materials accommodated by the color cells corresponding to the portion according to the object color and a dithering algorism, so that the color cells present the object color in the form of mesh points manner via the coloring materials; and c13) repeating the execution of the step c11 and the step c12 until completing the settings of the color of the coloring materials accommodated by all of the color cells; and c14) generating the printing color data according to colors of the coloring materials accommodated by the color cells.

Preferably, the step c) comprises the following steps:

c21) retrieving an object color of one of the plurality portions of the color 3D object;

c22) calculating a color value corresponding to the object color;

c23) setting colors of the coloring materials accommodated by the color cells corresponding to the portion as the color value;

c24) repeating the execution of the step c21), the step c22) and the step c23) until completing the settings of the color of the coloring materials accommodated by all of the color cells; and c25) generating the printing color data according to colors of the coloring materials accommodated by the color cells.

Preferably, the slicing printing method for color 3D model further comprises the following steps:

e1) controlling a first nozzle to print the color cells layer by layer according to the printing object data; and e2) during the period of printing the color cells, controlling a second nozzle to fill the coloring materials respectively in the accommodating space of the color cells according to the printing color data.

Preferably, the step e1) is to print the color cells layer by layer from the bottom up. Only after the completion of filling in the coloring materials of the color cells on the bottom layer, the color cells on the up layer are being printed, so as to apply a plurality of bases of the color cells on the up layer as a plurality of top covers of the color cells on the bottom layer.

Preferably, the first nozzle is to use a UV curable resin to process printings, and imposing lights to the printed UV curable resin to harden the UV curable resin. The coloring materials are inks with different colors.

Preferably, the hardened UV curable resin is light-transparent.

Preferably, the step e2) is when the color cells on the same layer completing the printing, controlling the second nozzle to fill the color materials respectively in the accommodating space of the color cells on the same layer according to the printing color data.

The disclosed example can effectively realize the printing of the color 3D model through the inkjet manner via generating color cells configured to accommodate color materials.

DETAILED DESCRIPTION

A preferred embodiment with drawings in the disclosed example will be illustrated in details later.

Figure 1:
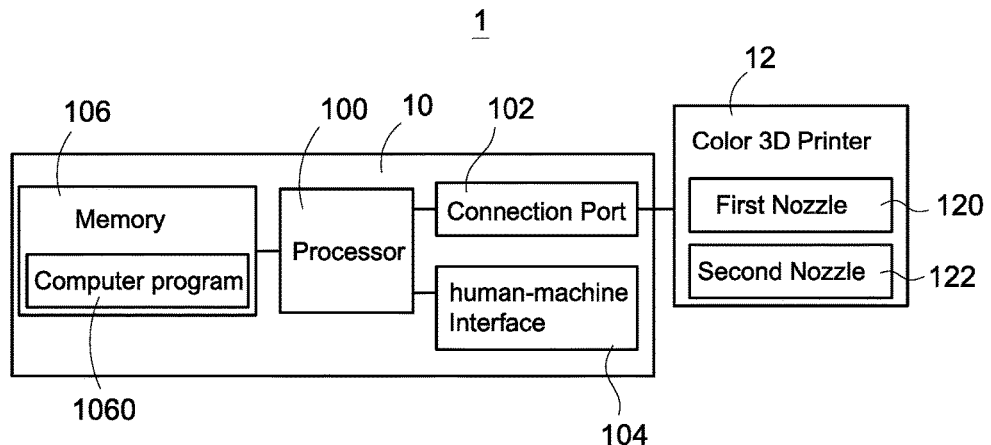
FIG. 1 is an architecture diagram of a 3D printing system of a first embodiment in the disclosed example.

Refer to FIG. 1. FIG. 1 is an architecture diagram of a 3D printing system of a first embodiment in the disclosed example. FIG. 1 discloses a 3D printing system 1 (printing system 1 as abbreviation) in the disclosed example. The printing system 1 mainly comprises a computer device 10 and a color 3D printer 12. Of course, the computer device 10 and the color 3D printer 12 can also be designed in one piece, so that the color 3D printer also has functions in the computer device 10. Unnecessary details will not be given herein.

The computer device 10 mainly includes a connection port 102 (such as an USB connection port) electrically connected to the color 3D printer 12, an human-machine interface 104 configured to receive operations and to output data (such as a keyboard, a mouse or a touch screen), a memory 106 configured to save data, and a processor 100 electrically connected to the above elements and configured to control the computer device. Preferably, the computer device 10 is a desktop computer, a notebook, a cloud server or a smart phone. But it should not be limited herein.

Preferably, the memory 106 can store a computer program 1060. The computer program 1060 records codes which can be executed by a computer. After the processor 100 executes the computer program 1060, the slicing printing method for color 3D model described in each of the embodiment of the disclosed example can be realized.

The color 3D printer 12 is configured to print a color 3D model. Specifically, the color 3D printer 12 is a Stereo-lithography (SL) 3D printer or a digital light processing (DLP) 3D printer, and at least including a first nozzle 120 and a second nozzle 122. The first nozzle 120 can use UV curable resins in liquid state to process printing, and using a light source module (not shown in the diagram) to impose lights (such as ultraviolet lights or laser lights) on the printed UV curable resins to harden the UV curable resin. Preferably, the hardened UV curable resin is light-transparent. The second nozzle 122 can use a plurality of coloring materials of different colors (such as inks of different colors, Acrylonitrile Butadiene Styrene (ABS) colorants or Polylactic Acid (PLA) of different colors, printing toners or inks of different colors) to process printing.

Preferably, the computer device 10 can execute a slicing process to a color 3D object inputted by users, and generating a printing color data and a printing object data (the printing color data and the printing object data can be encapsulated into the same file). Next, the color 3D printer 12 can control the first nozzle 120 to print a monochrome 3D model according to the printing object data, and controlling the second nozzle 122 to process coloring simultaneously on the monochrome 3D model according to the printing color data during the printing process, so as to generate a color 3D model.

Figure 2:
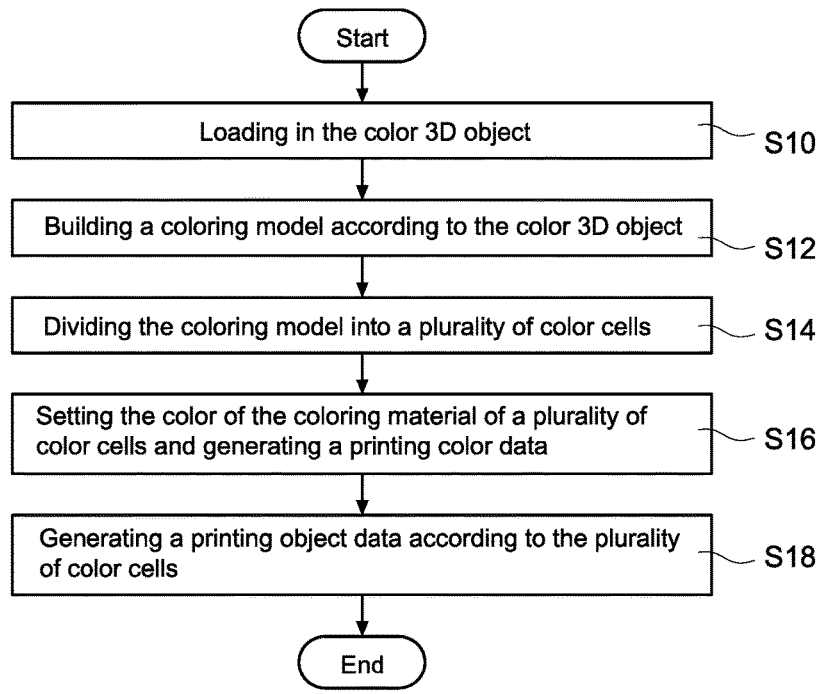
FIG. 2 is a flowchart of a slicing printing method for color 3D model of the first embodiment in the disclosed example.

Refer to FIG. 2. FIG. 2 is a flowchart of a slicing printing method for color 3D model of the first embodiment in the disclosed example. The slicing printing method for color 3D models (slicing printing method as abbreviation) of each embodiment in the disclosed example are mainly realized by the printing system 1 shown in the FIG. 1. The slicing printing method of the embodiment includes the following steps of executing the slicing process.

Step S10: the printing system 1 loads in the color 3D object.

Step S12: the printing system 1 builds a coloring model according to the color 3D object.

Preferably, the printing system 1 can simultaneously build the coloring model and an interior model according to the color 3D object, and can slice the interior model into a plurality of interior object layers. It is worth mentioning that, since users only care about the match of appearances between the manufactured color 3D model and the color 3D model, as for interior colors or structures are not concerned by users. Therefore, the printing system 1 can build the coloring model with an appearance corresponding to the color 3D object only according to the color 3D model, and doesn't build the interior model irrelevant to the appearance.

Or, the printing system 1 can build the coloring model with an appearance corresponding to the color 3D object according to the color 3D object, and build the interior model irrelevant to appearances. Also, lowering the cost of printing and accelerating the printing speed can be done in the following processes by making different processes to the coloring model and the interior model such as monochrome printing of the interior model, decreasing the usage amount of supplies of the interior model such as decreasing the filling density, etc.

Step S14: the printing system 1 divide the coloring model into a plurality of color cells, wherein a shell of each of the color cell forms an accommodating space configured to accommodate the coloring material. Preferably, the printing system 1 further slices the color cells into a plurality of color object layers.

It is worth mentioning that, each of the color cell in configured as a minimum coloring unit of the color 3D model, which can show the color of a color cell after filling in the coloring material, like 2D image pixels. Thereby, the color 3D model stacked by large amount of the color cells can show a colorful appearance.

Also, even the coloring material is in liquid state (such as ink), the accommodating space of the color cells in the disclosed example can also accommodate the coloring material to achieve the coloring effect.

Step 16: the printing system 1 sets respectively the color of the coloring materials accommodated by the corresponding color cells according to the color of the color 3D object, generating the printing color data corresponding to the color 3D model. Preferably, the printing color data records positions of each of the color cells and the colors of the coloring materials accommodated by each of the color cells.

Step S18: the printing system 1 generates a printing object data associated with the printing color data according to the colors of the coloring materials accommodated by each of the color cell.

Preferably, the printing system 1 is first associating the color object layers to the corresponding colors of the coloring materials accommodated by the color cells, and then generating the printing object data according to the interior object layers and the associated color object layers.

The disclosed example accommodates coloring materials via generating color cells having accommodating spaces, which can effectively realize the printing of color 3D models through the inkjet manner.

Figure 3:
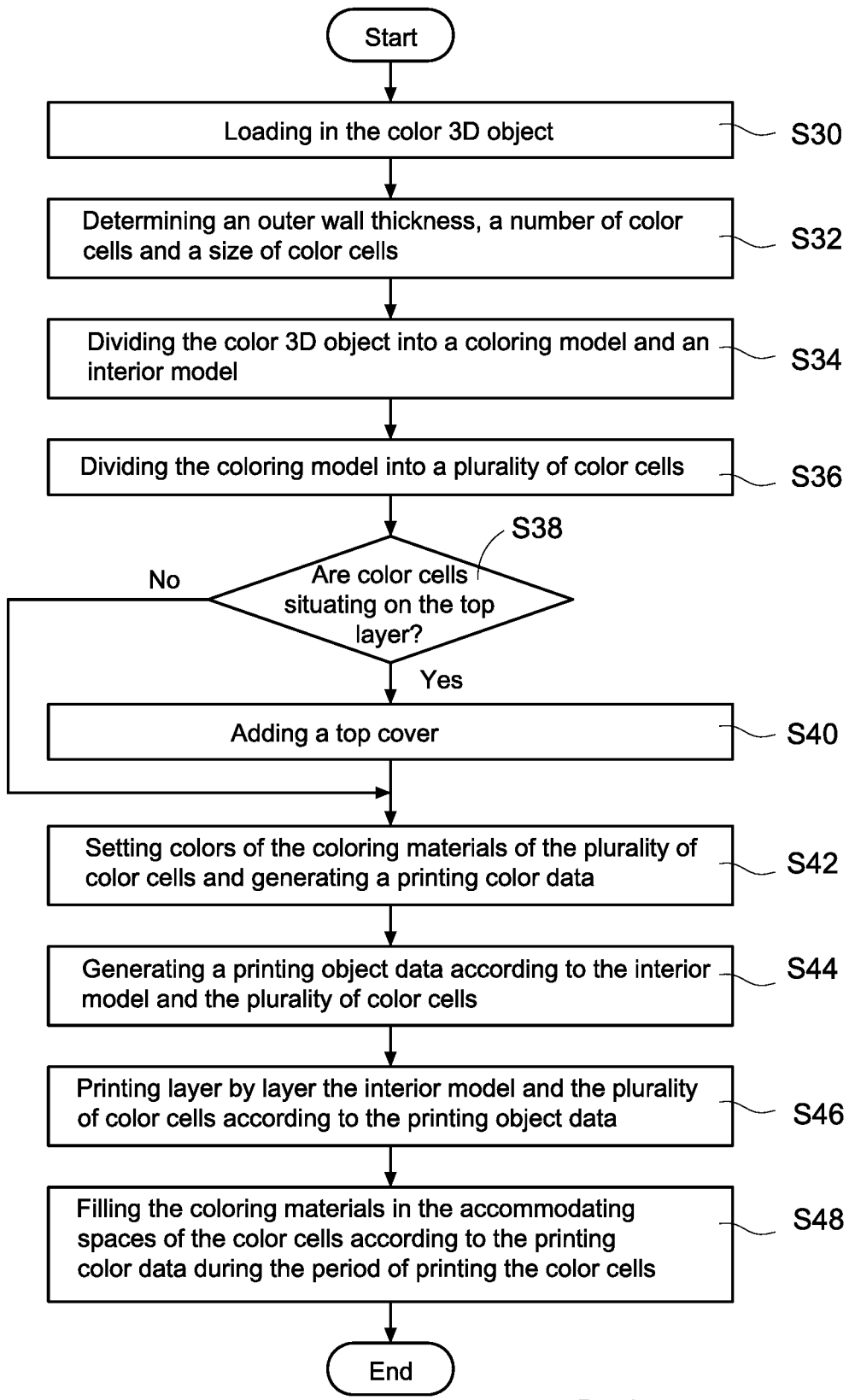
FIG. 3 is a flowchart of a slicing printing method for color 3D model of a second embodiment in the disclosed example.

FIG. 3 is a flowchart of a slicing printing method for color 3D model of a second embodiment in the disclosed example. The slicing printing method in the disclosed example includes executing slicing process steps S30-S44 and executing printing process steps S46-S48.

Step S30: the printing system 1 loads in the color 3D object.

Step S32: the printing system 1 determines a coloring thickness, a number of color cells, and a size of color cells of the color cells. Specifically, the printing system 1 can determine the color thickness, the number of color cells, and the size of color cells according to the size of the loaded color 3D object or user settings. If the color thickness is thicker, the number of color cells is more, or the size of color cells is smaller, then the manufactured color appearances of the color 3D model are finer. But the cost of printing is higher. On the other hand, if the color thickness is thinner, the number of color cells is fewer, or the size of color cells is larger, then the manufactured color appearances of the color 3D model are coarser. But the cost of printing is lower.

Figure 4:
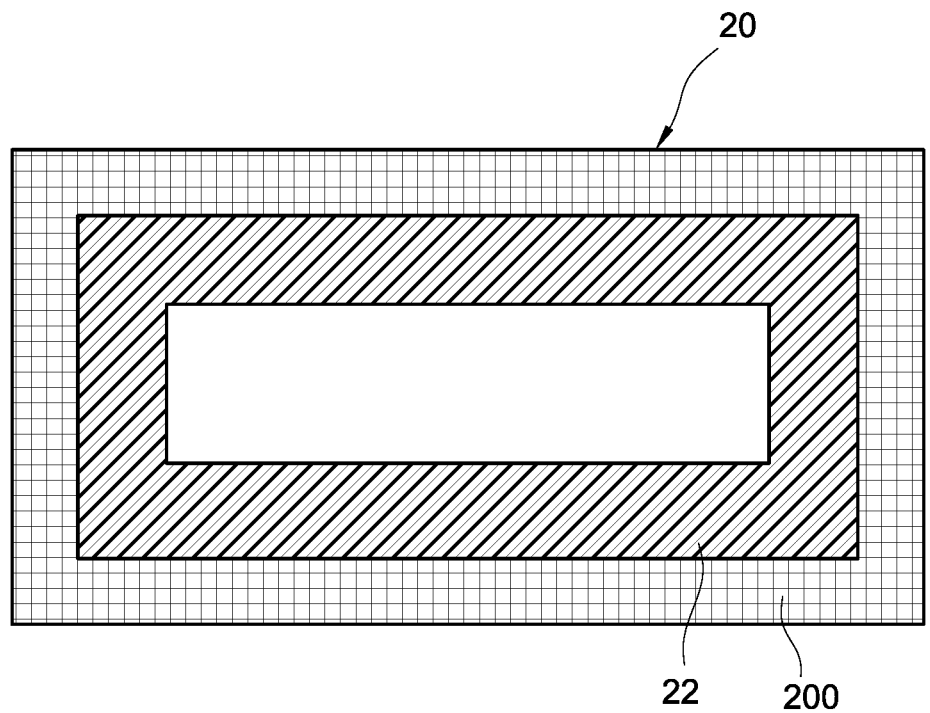
FIG. 4 is a cross-section diagram of top view of a divided color 3D object in the disclosed example.

Step S34: the printing system 1 divides the color 3D object into the coloring model and the interior model according to the color thickness. Preferably, the printing system 1 divides the color 3D object into the coloring model and the hollow interior model (the hollow interior model 22 as shown in FIG. 4) according to the color thickness, the number of color cells and the size of color cells. By generating the hollow interior model, the usage amount of printing supplies can be effectively lower down.

Although the embodiment is to generate the hollow interior model, it should not be limited herein. The printing system 1 can also divide the color 3D object into the coloring model and the solid interior model. By generating the solid interior model, the strength of the structure of the manufactured color 3D model can be effectively enhanced.

Step S36: the printing system 1 divides the coloring model into the multilayer stacked color cells according to the number of color cells and the size of color cells. Preferably, the color cells are columns (such as cube, cuboid, Hexagonal prism or cylinder).

Refer to FIG. 4 together. FIG. 4 is a cross-section diagram of top view of a divided color 3D object in the disclosed example, configured to exemplify the color cells after division and the interior model. As shown in FIG. 4, the printing system 1 divides the color 3D object into the coloring model 20 and the hollow interior model 22, and divides the coloring model 20 into the color cells 200 (cube in the example).

Also, since the interior model 22 is hollow, the printing system 1 only prints the interior model 22 on its own while printing. The hollow part of the interior model 22 will not be printed, so as to effectively save the usage amount of supplies.

Step S38: the printing system 1 judges if there is any of the color cells situated on the top layer of the color 3D model. If a color cell situated on the top layer is judged, executing the step S40. Otherwise, executing the step S42.

Step S40: the printing system 1 adds a top cover on the shell of the color cell situated on the top layer. Specifically, to avoid the spilling out of the coloring material, the color cell needs to be sealed. Also, since the color cells stack mutually (as shown in FIG. 5 to FIG. 9), a base of the color cell on the up layer can act directly as the top cover of the color cell on the bottom layer without adding the top cover additionally. Therefore, only the color cell of the top layer needs adding the top cover. Preferably, the printing system 1 is adding a plurality of top cover object layers corresponding to the top cover to positions corresponding to the color object layers, and to add the top cover.

Step S42: the printing system 1 sets respectively color of the coloring materials accommodated by the color cells according to the color of the color 3D model, and generates the printing color data corresponding to the color 3D model.

Preferably, the printing system 1 can set only portions of colors of the coloring materials accommodated by the color cells. Thereby, during the subsequent printing processes, only portions of the color cells will be filled in the coloring materials. The other portions of the color cells will not be filled in the coloring materials.

The disclosed example, via setting only a portion of colors of the coloring materials accommodated by the color cells, the other portion of the color cells will not be filled in the coloring materials while printing. It can effectively save the usage amount of coloring materials. Also, via alternate permutation between the color cells without filled in coloring materials and the color cells with filled in coloring materials, the color 3D model manufactured by the slicing printing method of the embodiment can present more abundant variations of color shades.

Preferably, the printing color data includes a printing color path of the second nozzle 122. There is a plurality of restoring points corresponding respectively to a plurality of switching points set on the printing color path. When the color 3D printer 12 controls the second nozzle 122 to process printing along the printing color path, the specified coloring material can fill in the specified place.

Step S44: the printing system 1 generates the printing object data associated with the printing color data according to the printing color data, the interior model 22 and the color cells.

Preferably, the printing object data includes a printing object path of the first nozzle 120. When the color 3D printer 12 controls the first nozzle 120 to process printing along the printing object path, the color cells and the interior model can be printed out.

Also, the printing system 1 sets the switching points in the printing object path, and associates each of the switching point respectively to the corresponding restoring point of the printing color path of the printing color data, wherein each of the switching point is a printing completion point of the color object layer of the color cells on the same layer.

Thereby, during the subsequent printing processes, when the printing system 1 prints along the printing object path to the switching point (i.e. completing the printing of the color cells on the same layer), the second nozzle 122 can be subsequently controlled to start along the printing color path from the corresponding restoring point to fill the correct coloring material in the color cells in which the printing has completed.

It is worth mentioning that, although in the embodiment, a printing completion point of the color object layer of the color cells on the same layer is set as the switching point, but it should not be limited herein. In another embodiment of the disclosed example, a printing completion point of each of the color cells can be set as the switching point, so that after the printing system 1 completes printings of each of the color cells, the filling of the corresponding coloring material in the color cells in which the printing has completed can be without interruption.

Step S46: the color 3D printer 12 of the printing system 1 controls the first nozzle 120 to print layer by layer the interior model 22 and the color cells according to the printing object data.

Preferably, the color 3D printer 12 controls the first nozzle 120 according to the printing object data to print the interior object layers of the interior model and the color object layers corresponding to the color cells layer by layer from the bottom up along the printing object path using UV curable resins.

Step S48: During the period of printing the color cells, the color 3D printer 12 of the printing system 1 controls the second nozzle 122 to fill the coloring materials respectively in the accommodating spaces of the color cells according to the printing color data. Preferably, during the period of printing the color cells by controlling the first nozzle 120, the color 3D printer 12 simultaneously controls the second nozzle 122 to fill the corresponding coloring material in the accommodating space of the color cells which have been printed according to the printing color data.

Preferably, when the printing of the color cells on the same layer are complete, i.e. the first nozzle 120 printing to one of the switching points along the printing object path, the color 3D printer 12 controls the second nozzle 122 according to the printing color data to fill the corresponding coloring materials respectively in the accommodating spaces of the color cells on the same layer, in which the printing has completed along the printing color path, i.e. the second nozzle 122 starting the printing from the restoring point corresponding to the switching point along the printing color path.

Also, after the completion of filling in the coloring materials, i.e. the second nozzle 122 printing along the printing color path to the another restoring point corresponding to the switching point, the 3D printer 12 continues to print the color cells of the next layer, i.e. the first nozzle 100 continuing the printing from the switching point along the printing object path.

Thereby, the disclosed example can manufacture the color 3D model corresponding to the color 3D model.

Figure 5:
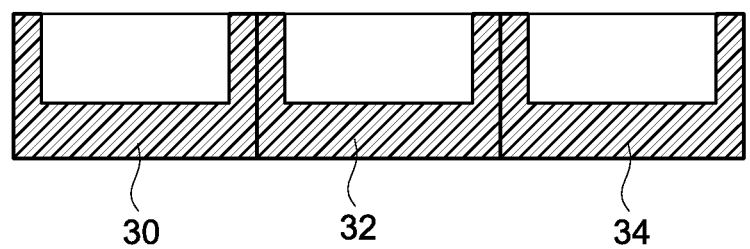
FIG. 5 is a first cross-section view of a color cell of the color 3D object in the disclosed example.
Figure 6:
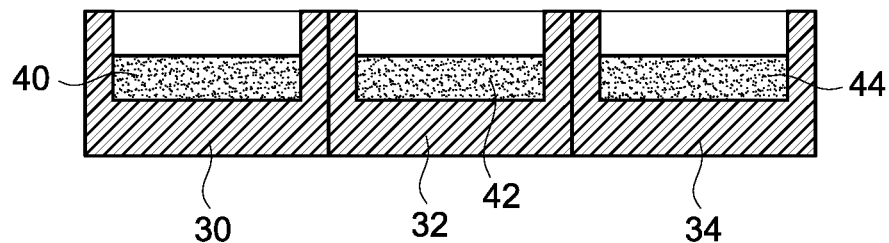
FIG. 6 is a second cross-section view of a color cell of the color 3D object in the disclosed example.
Figure 7:
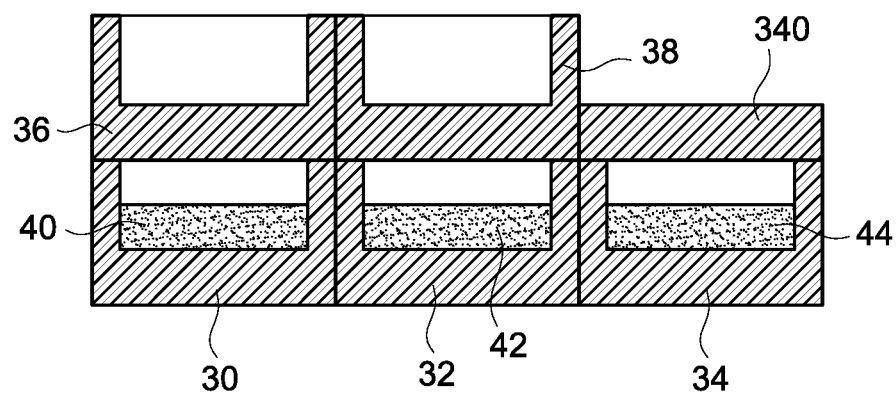
FIG. 7 is a third cross-section view of a color cell of the color 3D object in the disclosed example.
Figure 8:
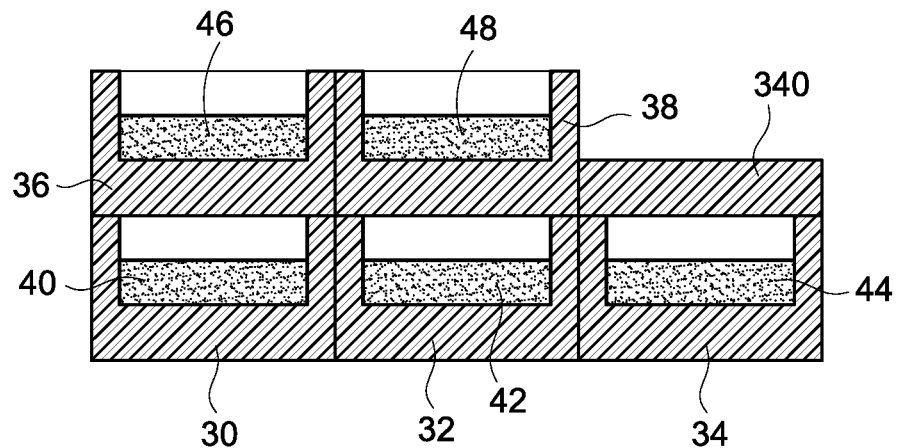
FIG. 8 is a fourth cross-section view of a color cell of the color 3D object in the disclosed example.
Figure 9:
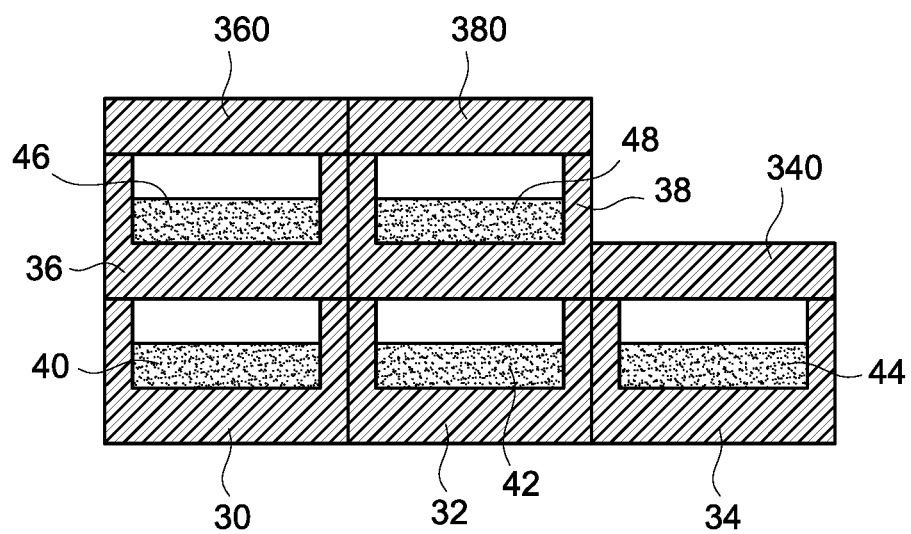
FIG. 9 is a fifth cross-section view of a color cell of the color 3D object in the disclosed example.

Refer to FIG. 5 to FIG. 9 simultaneously. FIG. 5 is a cross-section view of a first color cell of the color 3D object in the disclosed example. FIG. 6 is a cross-section view of a second color cell of the color 3D object in the disclosed example. FIG. 7 is a cross-section view of a third color cell of the color 3D object in the disclosed example. FIG. 8 is a cross-section view of a fourth color cell of the color 3D object in the disclosed example. FIG. 9 is a cross-section view of a fifth color cell of the color 3D object in the disclosed example, configured to illustrate how to print the color cells and how to fill in the coloring materials in the disclosed example. Also, in the example, the color 3D printer 12 is to control the first nozzle 120 to use light-transparent supplies to process printings.

As shown in FIG. 5, the color 3D printer 12 first controls the first nozzle 120 to print layer by layer a plurality of color object layers, so as to print out three light-transparent cube color cells 30-34.

Then, as shown in FIG. 6, the color 3D printer 12 controls the second nozzle 122 fill a color material of different colors in an accommodating space of each of the color cells 30-34 (red inks 40, green inks 42 and blue inks 44 as examples).

Next, as shown in FIG. 7, after the completion of filling in the coloring materials of the color cells 30-34 on the bottom layer, the color 3D printer 12 controls the first nozzle 120 again to continue printing layer by layer the color object layers on the up layer, so as to print out another two color cells 36-38, and to print out a top cover 340 of the color cell 34. Since the base of the two color cells 36, 38 can act directly as top covers of the two color cells 30, 32 on the bottom layer, and the top cover 340 has been set on the color cell 34, the color cells 30-34 are all in a sealed state. The coloring materials will not spill out.

Next, as shown in FIG. 8, the color 3D printer 12 controls the second nozzle 122 to fill the coloring material of different colors in the accommodating space of each of the color cells 36, 38 (red inks 46 and green inks 48 as examples).

Next, as shown in FIG. 9, the color 3D printer 12 controls the first nozzle 120 again to continue to print the color object layer, so as to seal up by printing out the top cover 360 of the color cell 36 and (by printing out) the top cover 380 of the color cell 38. Thereby, since the all color cells 30-38 are in a sealed state, the coloring materials will not spill out. Also, since the color cells 30-38 are manufactured by light-transparent supplies, the appearances of the color cells 30-38 can show colors accommodated by the coloring materials.

Figure 10:
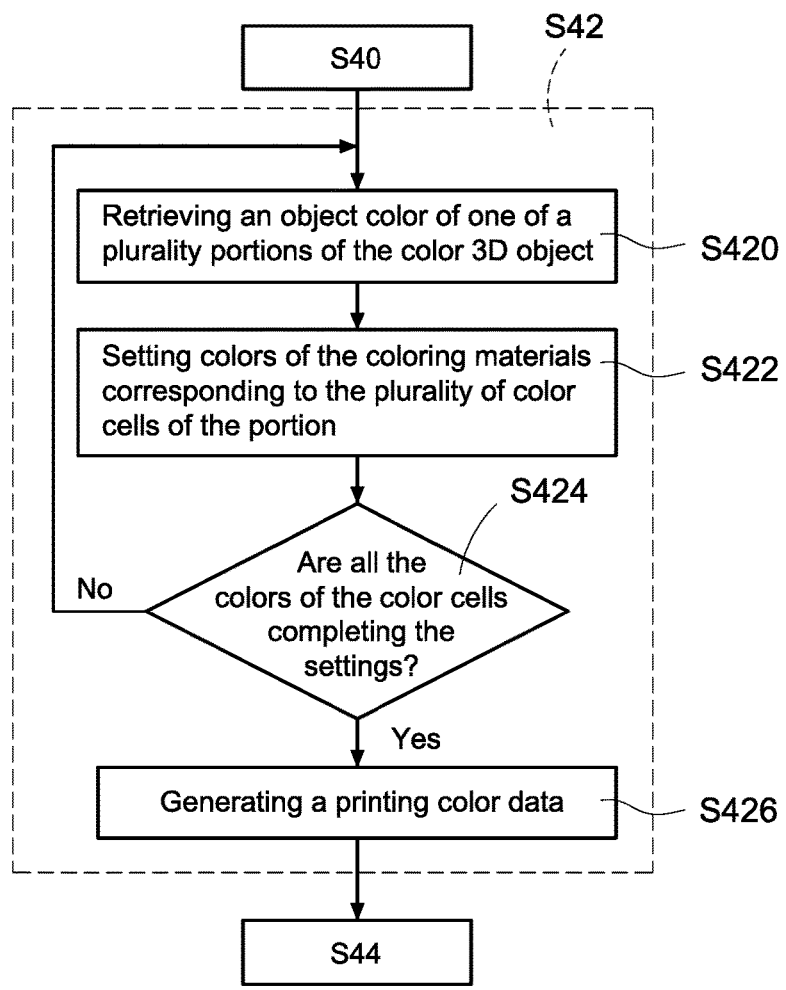
FIG. 10 is a partial flowchart of a slicing printing method for color 3D model of a third embodiment in the disclosed example.

Refer to FIG. 10. FIG. 10 is a partial flowchart of a slicing printing method for color 3D model of a third embodiment in the disclosed example. The difference between the embodiment and the second embodiment is that the step S42 of the slicing printing method in the embodiment further includes the following steps.

Step S420: the printing system 1 retrieves an object color of one of plurality portions of the color 3D object. Preferably, the object color of each of the portion of the color 3D object is set by users.

Step S422: the printing system 1 sets colors of the coloring materials corresponding to the color cells of the portion.

Preferably, the printing system 1 is to set colors of the coloring materials accommodated by the color cells corresponding to the portion according to a dithering algorism and the object color, so that the color cells present the object color in the form of mesh points via the accommodated coloring materials.

Specifically, the human visual system is like a set of low-pass filter, which will automatically filter the seen high frequency part of an image (such as details of shells of the color cells), and keep the low frequency part (such as the color shown by the color cell). The dithering algorithm is, by arranging the color cells of a monochrome (such as black) in different densities, creating multi colors (such as black, dark gray, light grey or white) illusion using the above characteristics, so as to expand the displayable color gamut. Also, when the size of the color cells is smaller or the amount of the color cells are more, the above effect will be more obvious.

Figure 11:
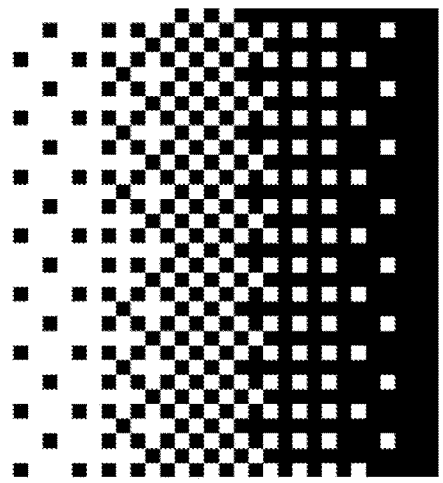
FIG. 11 is a schematic diagram of a dithering process in the disclosed example.

Refer to FIG. 11. FIG. 11 is a schematic diagram of a dithering process in the disclosed example, configured to illustrate the dithering algorism. The pattern shown in FIG. 11 is composed of 32×32 color cells, and there are only black and white, two kinds of the color cells. As shown in the figure, the mesh points density of black color cells decreases from right (highest) to left (lowest), and can create the illusion of the gradient from black to white.

Although in the above illustration, only the color cells accommodating the white coloring materials and the color cells accommodating the black materials are used to process the dithering, but it should not be limited herein. In other embodiments, the printing system 1 can simultaneously arrange the multi coloring materials accommodating different colors (such as cyan, magenta, yellow, black, and white) in different densities according to the dithering algorism, so as to expand the displayable color gamut.

It is worth mentioning that, different from the inks which are easy to be mixed up, existing 3D printing supplies (such as ABS or PLA) cannot be uniformly mixed up after melting. They cannot arbitrarily use supplies of different colors to modulate colors needed and process color 3D printings. Therefore, existing 3D printing supplies can only be used in multi-color 3D printing. It cannot be used in color 3D printings. The disclosed example can use a small amount of colors to realize color 3D printings via using the dithering algorism to expand the displayable color gamut.

Although in the embodiment, the printing system 1 presents the object color via mesh points manner, but it should not be limited herein. In another embodiment of the disclosed example, the printing system 1 can also directly set all the colors of the color cells corresponding to the portion as the object color, in which the coloring materials are accommodated in the color cells in the portion.

Specifically, the printing system 1 can calculate a color value corresponding to the object color according to the object color and a color algorism, and sets all the colors of the color cells corresponding to the portion as the color value, so that the printed color cells show the same color, in which the coloring materials are accommodated in the color cells in the portion.

Preferably, the color algorism transforms the specifically object color into the color value corresponding to the combination ratio of the inks of each color (such as cyan, magenta, yellow, black, white), so that the second nozzle 122 can directly control the amount of inks of the inks of each color according to the color value and to mix out the correct ink color.

Step S424, the printing system 1 judges if all the colors of the color cells completing the settings. If "yes", executing the step S426. If "no", executing again the S420.

Step S426: the printing system 1 generates the printing color data according to the colors of the color cells.

Figure 12:
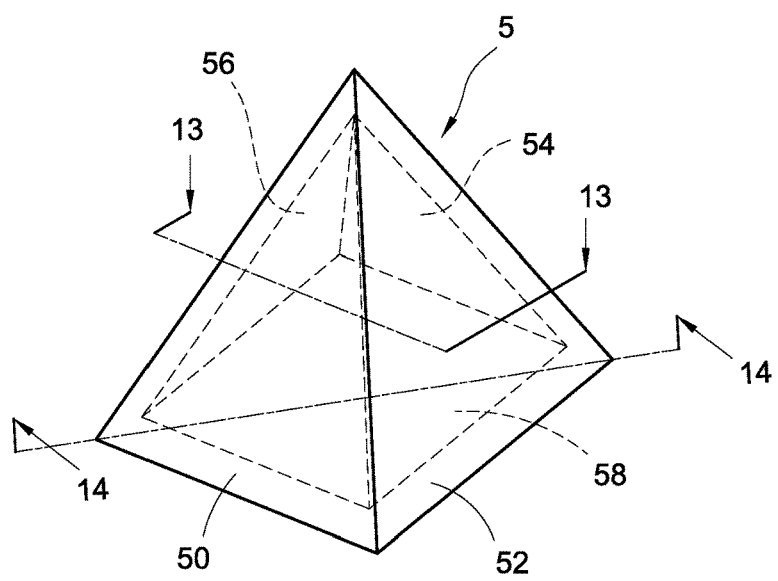
FIG. 12 is a schematic diagram of a first color 3D model in the disclosed example.
Figure 13:
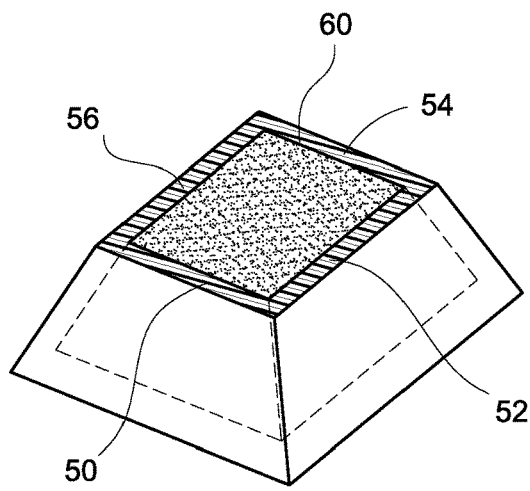
FIG. 13 is a cross-section diagram of top view of the first color 3D model in the disclosed example.
Figure 14:
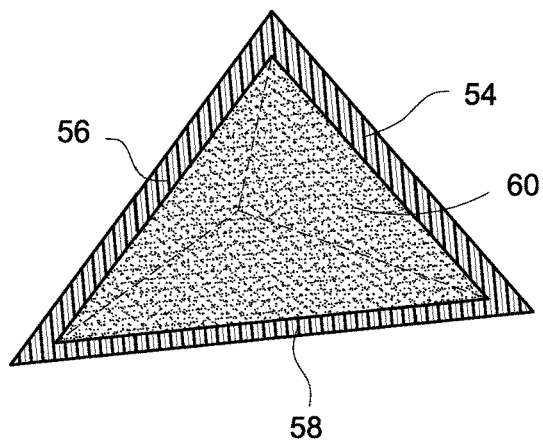
FIG. 14 is a cross-section diagram of side view of the first color 3D model in the disclosed example.

Refer simultaneously to FIG. 12 to FIG. 14. FIG. 12 is a schematic diagram of a first color 3D model in the disclosed example. FIG. 13 is a cross-section diagram of top view of the first color 3D model in the disclosed example. FIG. 14 is a cross-section diagram of side view of the first color 3D model in the disclosed example. They (FIG. 12 to FIG. 14) are configured to exemplify the manufactured color 3D model using the slicing printing method of the disclosed example.

As shown in FIG. 12, in the example, the color 3D model is a quadrangular pyramid model 5, and the quadrangular pyramid model 5 has five surfaces (a green side 50, a red side 52, an orange side 54, a purple side 56, and a blue bottom surface 58).

After cutting the quadrangular pyramid model 5 along a section line 13, a cross-section diagram of top view as shown in FIG. 13 can be seen. The interior of the quadrangular pyramid model 5 is a light-transparent solid interior model 60 (printed using light-transparent UV curable resins for instance), and only coloring model has color (i.e. stacked by the color cells with different colors).

After cutting the quadrangular pyramid model 5 along a section line 14, the cross-section diagram as shown in FIG. 14 can be seen. The interior of the quadrangular pyramid model 5 is a solid interior model 60, and only coloring model has color.

Figure 15:
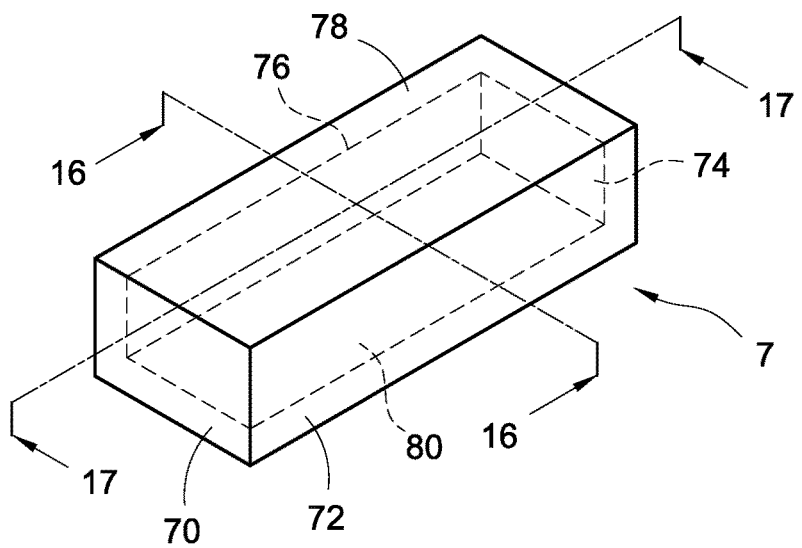
FIG. 15 is a schematic diagram of a second color 3D model in the disclosed example.
Figure 16:
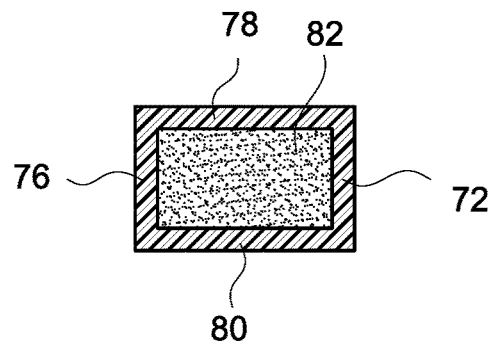
FIG. 16 is a cross-section diagram of side view of the short side of the second color 3D model in the disclosed example.
Figure 17:
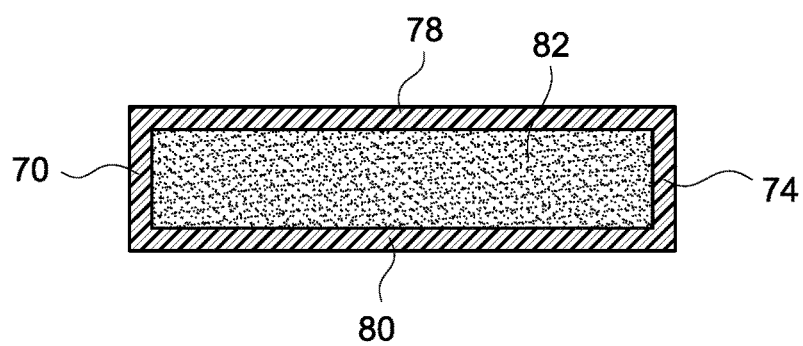
FIG. 17 is a cross-section diagram of side view of the long side of the second color 3D model in the disclosed example.

Refer to FIG. 15 to FIG. 17 simultaneously. FIG. 15 is a schematic diagram of a second color 3D model in the disclosed example. FIG. 16 is a cross-section diagram of side view of the short side of the second color 3D model in the disclosed example. FIG. 17 is a cross-section diagram of side view of the long side of the second color 3D model in the disclosed example. They (FIG. 15 to FIG. 17) are configured to exemplify the manufactured color 3D model using the slicing printing method of the disclosed example.

As shown in FIG. 15. In the example, the color 3D model is a column model 7, and the column model 7 includes six surfaces (a green side 70, a red side 72, a grey side 74, an orange side 76, a blue top surface 78, and a purple bottom surface 80).

After cutting the column model 7 along a section line 16, the cross-section diagram of side view of the short side as shown in FIG. 16 can be seen. The interior of the column model 7 is a light-transparent solid interior model 82, and only coloring model has color.

After cutting the column model 7 along a section line 17, the cross-section diagram of side view of the long side as shown in FIG. 17 can be seen. The interior of the column model 7 is a light-transparent solid interior model 82, and only color model has color.

The above mentioned are only preferred specific examples in the disclosed example, and are not thence restrictive to the scope of claims of the disclosed example. Therefore, those who apply equivalent changes incorporating contents from the disclosed example are included in the scope of this application, as stated herein.

What is claimed is:

1. A slicing printing method for color 3D model, the method comprising the following steps embodied by a processor:
 a) building a coloring model according to a color 3D object;
 b) dividing the coloring model into a plurality of color cells, wherein a shell of each of the color cells forming an accommodating space configured to accommodate a color material;
 c) setting respectively the colors of the color materials accommodated in each of the color cells according to the color of the color 3D object, and generating a printing color data corresponding to the color 3D model;

d) generating a printing object data associated with the printing color data according to the printing color data and the color cells;
e) controlling a first nozzle of a color 3D printer to print the color cells layer by layer according to the printing object data; and
f) during the period of printing the color cells, controlling a second nozzle of the color 3D printer to fill the coloring materials respectively in the accommodating space of the color cells according to the printing color data.

2. The slicing printing method for color 3D model as claim 1, wherein the step a) is to build the coloring model and an interior model according to the color 3D object; the step d) is to generate the printing object data corresponding to the color 3D model according to the printing color data, the interior model and the color cells.

3. The slicing printing method for color 3D model as claim 2, wherein the step a) comprising a step a1): dividing the color 3D model into the coloring model and the interior model according to a coloring thickness.

4. The slicing printing method for color 3D model as claim 3, wherein the step a1) is to divide the color 3D model into the coloring model and the hollow interior model.

5. The slicing printing method for color 3D model as claim 3, wherein the step b) comprises a step b1): dividing the coloring model into the color cells according to a number of color cells and a size of color cells.

6. The slicing printing method for color 3D model as claim 5, wherein the color cells are columns.

7. The slicing printing method for color 3D model as claim 5, wherein the step b) further comprises a step b2): adding a top cover on the shell of the color cell when judging one of the color cells is on the top layer.

8. The slicing printing method for color 3D model as claim 7, wherein the step a1) divides the color 3D model according to the coloring thickness, the number of color cells and the size of color cells.

9. The slicing printing method for color 3D model as claim 1, wherein the step c) comprises the following steps:
   c11) retrieving an object color of one of the plurality portions of the color 3D object;
   c12) setting colors of the color materials accommodated by the color cells corresponding to the portion according to the object color and a dithering algorithm, so that the color cells present the object color in the form of mesh points manner via the coloring materials; and
   c13) repeating the execution of the step c11 and the step c12 until completing the settings of the color of the coloring materials accommodated by all of the color cells; and
   c14) generating the printing color data according to colors of the coloring materials accommodated by the color cells.

10. The slicing printing method for color 3D model as claim 1, wherein the step c) comprises the following steps:
    c21) retrieving an object color of one of the plurality portions of the color 3D object;
    c22) calculating a color value corresponding to the object color;
    c23) setting colors of the coloring materials accommodated by the color cells corresponding to the portion as the color value;
    c24) repeating the execution of the step c21), the step c22) and the step c23) until completing the settings of the color of the coloring materials accommodated by all of the color cells; and
    c25) generating the printing color data according to colors of the coloring materials accommodated by the color cells.

11. The slicing printing method for color 3D model as claim 1, wherein the step e) is to print the color cells layer by layer from the bottom up, only after the completion of filling in the coloring materials of the color cells on the bottom layer, the color cells on the up layer are being printed, so as to apply a plurality of bases of the color cells on the up layer as a plurality of top covers of the color cells on the bottom layer.

12. The slicing printing method for color 3D model as claim 1, wherein the first nozzle is to use a UV curable resin to process printings, and to impose lights to the printed UV curable resin to harden the UV curable resin, and the coloring materials are inks with different colors.

13. The slicing printing method for color 3D model as claim 12, wherein the hardened UV curable resin is light-transparent.

14. The slicing printing method for color 3D model as claim 1, wherein the step f) is when the color cells on the same layer completing the printing, controlling the second nozzle to fill the color materials respectively in the accommodating space of the color cells on the same layer according to the printing color data.

* * * * *